United States Patent
Nuytten et al.

(10) Patent No.: US 12,216,057 B2
(45) Date of Patent: Feb. 4, 2025

(54) METHOD AND APPARATUS FOR MEASURING A LATERAL DEPTH IN A MICROSTRUCTURE

(71) Applicant: IMEC VZW, Leuven (BE)

(72) Inventors: Thomas Nuytten, Pellenberg (BE); Janusz Bogdanowicz, Schaarbeek (BE)

(73) Assignee: IMEC VZW, Leuven (BE)

( * ) Notice: Subject to any disclaimer, the term of this patent is extended or adjusted under 35 U.S.C. 154(b) by 503 days.

(21) Appl. No.: 17/371,609

(22) Filed: Jul. 9, 2021

(65) Prior Publication Data

US 2022/0018781 A1  Jan. 20, 2022

(30) Foreign Application Priority Data

Jul. 14, 2020  (EP) ..................... 20185746

(51) Int. Cl.
*G01N 21/65* (2006.01)
*H01L 21/66* (2006.01)

(52) U.S. Cl.
CPC ............ *G01N 21/65* (2013.01); *H01L 22/12* (2013.01)

(58) Field of Classification Search
CPC ............................... G01N 21/65; H01L 22/12
USPC .......................................................... 438/14
See application file for complete search history.

(56) References Cited

U.S. PATENT DOCUMENTS

| | | | | |
|---|---|---|---|---|
| 6,650,423 | B1 * | 11/2003 | Markle | G01B 11/00 356/601 |
| 2003/0071994 | A1 * | 4/2003 | Borden | G01N 21/9501 356/326 |
| 2005/0057755 | A1 * | 3/2005 | Johnson | H01L 21/67 257/E21.53 |
| 2005/0118735 | A1 | 6/2005 | Mantz et al. | |
| 2006/0077403 | A1 * | 4/2006 | Zaidi | H01L 22/34 356/625 |
| 2009/0122321 | A1 * | 5/2009 | Rosenthal | G01B 11/0625 356/496 |

(Continued)

OTHER PUBLICATIONS

Nuytten, T., et al., "Edge-Enhanced Raman Scattering in Narrow sGe Fin Field-Effect Transistor Channels", Applied Physics Letters,; 2015, vol. 106(6), article 033107, pp. 1-4.

(Continued)

*Primary Examiner* — Dzung Tran
(74) *Attorney, Agent, or Firm* — McDonnell Boehnen Hulbet & Berghoff LLP

(57) ABSTRACT

A method and apparatus are provided for a spectroscopic measurement for determining a lateral recess depth in the sidewall of a microstructure. The structure is formed on a larger substrate with the sidewall in an upright position relative to the substrate, and the recess extends essentially parallel to the substrate. The recess may be an etch depth obtained by etching a first layer relative to two adjacent layers, the layers oriented parallel to the substrate, the etch process progressing inward from the sidewall. An incident energy beam falling on the structure generates a spectroscopic response captured and processed respectively by a detector and a processing unit. The response comprises one or more peaks related to the material or materials of the substrate and the structure. According to the method, a parameter is derived from said one or more peaks, that is representative of the lateral recess depth.

10 Claims, 6 Drawing Sheets

(56) References Cited

U.S. PATENT DOCUMENTS

| 2014/0024143 | A1* | 1/2014 | Li | ............ | H01L 22/26 |
| | | | | | 156/345.24 |
| 2018/0172609 | A1 | 6/2018 | Lee et al. | | |
| 2018/0372644 | A1 | 12/2018 | Barak et al. | | |
| 2019/0178788 | A1 | 6/2019 | Nguyen et al. | | |

OTHER PUBLICATIONS

Extended European Search Report from the European Patent Office, for European Patent No. 21183291.0, dated Dec. 13, 2021, pp. 1-9.

* cited by examiner

METHOD AND APPARATUS FOR MEASURING A LATERAL DEPTH IN A MICROSTRUCTURE

CROSS-REFERENCE

This application claims priority from European Patent Application No. 20185746.3, filed on Jul. 14, 2020, which is incorporated by reference in its entirety.

FIELD OF THE DISCLOSURE

The present disclosure is related to the field of metrology of patterned microstructures produced in semiconductor processing. Within the context of this description, a microstructure is a structure having dimensions of individual features, for example the width and length of a fin, in the order of nanometers up to one or more micrometers.

BACKGROUND OF THE DISCLOSURE

The semiconductor processing industry has been driven by scaling of devices, cells and functions to maintain a steady increase in performance per area and cost resulting in device architectures below 10 nm becoming an HVM (High Volume Manufacturing) reality. However, due to their extremely small nm-scale dimensions, the manufacturing of the aforementioned devices requires a precise control over their geometry, especially the CD (Critical Dimension). At the same time, technology nodes of 4 nm and beyond will see increased demand for 3D metrology of buried information. In the case of a lateral cavity etch, a certain amount of material is removed laterally, for example below a nitride and/or oxide stack, which greatly hampers accurate control of the etched depth parameter. Such monitoring is commonly done with a metrology step involving Critical Dimension Scanning Electron Microscope (CD-SEM) or Optical Critical Dimension (OCD), but CD-SEM is not sensitive to such buried information and OCD relies on complex models where many geometrical parameters of the complex (oxide, nitride, polysilicon . . . ) stack may be correlated to the cavity depth such that the latter cannot be uniquely determined by fitting.

SUMMARY OF THE DISCLOSURE

The disclosure aims to provide a solution to the problems set out in the previous paragraph. This aim is achieved by the methods and by an apparatus as disclosed in the appended claims.

The method of the disclosure applies a spectroscopic measurement for determining a lateral recess depth in the sidewall of a microstructure. The structure can be formed on a larger substrate with the sidewall in an upright position relative to the substrate, and the recess extends essentially parallel to the substrate. The recess may be an etch depth obtained by etching a first layer relative to two adjacent layers, the layers oriented parallel to the substrate, the etch process progressing inward from the sidewall. According to the method of the disclosure, an energy beam is directed at the structure. The incident beam falling on the structure generates a spectroscopic response captured and processed respectively by a detector and a processing unit. The response comprises one or more peaks related to the material or materials of the substrate and the structure. According to the disclosure, a parameter can be derived from said one or more peaks, that is representative of the lateral recess depth, said parameter having a previously established one-on-one relation to said depth. From the measured parameter, the depth can be derived, using the previously established relation.

The method can be fast and, according to the majority of embodiments, non-invasive and therefore represents a way of performing metrology on buried structures, without the disadvantages of present techniques such as CD-SEM or OCD. The method can be used for in-line measurements of a lateral depth in a semiconductor processing line.

The disclosure is in particular related to a method for measuring a lateral recess depth in a microstructure positioned on a substrate, the structure having an elongate sidewall in an upright position relative to the substrate, the structure comprising at least one recess formed from the sidewall inwards and extending essentially parallel to the surface of the substrate, the method comprising the steps of:
  directing an energy beam at the structure,
  measuring a spectroscopic response generated by the interaction between the incident beam and the structure,
  detecting one or more peaks in the response and deriving from said one or more peaks a parameter value that is representative of the recess depth, said parameter having a previously established one-on-one relation to the recess depth,
  deriving the recess depth from the detected parameter value, using the previously established relation.

According to an embodiment, the structure comprises at least one first layer, oriented essentially parallel to the surface of the substrate, the layer being sandwiched between two adjacent layers, and wherein the first layer is recessed relative to the adjacent layers, the recess being formed from the sidewall inwards.

According to an embodiment, the first layer can be formed of a first material and the adjacent layers are formed of a second material different from the first material.

According to an embodiment:
  the substrate is a silicon substrate,
  the structure is a fin-shaped structure having two elongate sidewalls, and wherein the first layer and the adjacent layers extend between said two sidewalls,
  the first material is SiGe and the second material is Si,
  the energy beam is a laser beam and the spectroscopic response is a Raman response,
  the fin structure comprises a silicon base portion that is uniform with the substrate, and on said base portion a stack of silicon nanosheets separated from each other and from the base portion by SiGe layers recessed relative to said Si nano-sheets,
  the parameter is the ratio between an intensity peak in the Raman spectrum related to vibrations of silicon atoms in the SiGe layers, and an intensity peak related to vibrations of silicon atoms in the silicon substrate, the base portion and/or the Si nanosheets,
  the previously established relation is linear.

According to an embodiment, the recess depth is an etch depth, formed in a process wherein the first layer is etched progressively with respect to the adjacent layers, the etch process progressing from the sidewall inwards.

According to an embodiment, the energy beam is a laser beam, the light of the laser beam being polarized in the length direction of the sidewall, and the spectroscopic response is a Raman spectroscopic response.

According to an embodiment, the energy beam is an electron beam, and the spectroscopic response is an Energy-Dispersive X-ray Spectroscopy response.

According to an embodiment, the energy beam is an X-ray beam, and the spectroscopic response is an X-Ray photoelectron Spectroscopy response.

According to an embodiment, the energy beam is an ion beam, and the spectroscopic response is a Secondary Ion Mass Spectrometry response.

According to an embodiment, the previously established relation is a linear relation.

The disclosure is equally related to an apparatus for performing the method according to the disclosure, the apparatus comprising:

An energy beam source,
A detector,
A processing unit configured to perform the following steps when the method is applied on a structure as described in appended claim 1:
  obtain the spectroscopic response from the detector,
  determine on the basis of the spectroscopic response, the value of the parameter,
  derive from the obtained parameter value and from the previously established one-on-one relation, the recess depth.

According to an embodiment, the source is a laser source and the detector and the processing unit are configured for Raman spectroscopy.

The disclosure is equally related to a computer program product configured to run on a processing unit and execute the steps described herein.

The disclosure is equally related to a use of the method according to the disclosure, for performing in-line measurements of lateral recess depth in a semiconductor processing line.

The disclosure is equally related to a use of the apparatus according to the disclosure, for performing in-line measurements of a recess depth in a semiconductor processing line.

DETAILED DESCRIPTION OF THE DISCLOSURE

In semiconductor reliability and characterization, spectroscopy can be used as a tool for measurements of mechanical stress, composition, doping and phase. Well-known spectroscopic techniques include X-Ray photoelectron spectroscopy (XPS), Energy-dispersive X-ray spectroscopy (EDS) and Raman spectroscopy.

As stated above and in the claims, the method of the disclosure allows to measure a lateral depth on the basis of a spectroscopic measurement, wherein a representative parameter can be derivable from the response, the parameter being in a previously established one-on-one relation with the depth, thereby allowing to derive the depth from the measurement.

The disclosure was verified on the basis of an etch process, but generally the disclosure is related to measuring a lateral recess depth, regardless of the process by which this depth has been produced. The method may for example also be used to measure progressively the decreasing depth of a lateral cavity, as the cavity is being filled with a filling material.

Figures 1A, 1B:
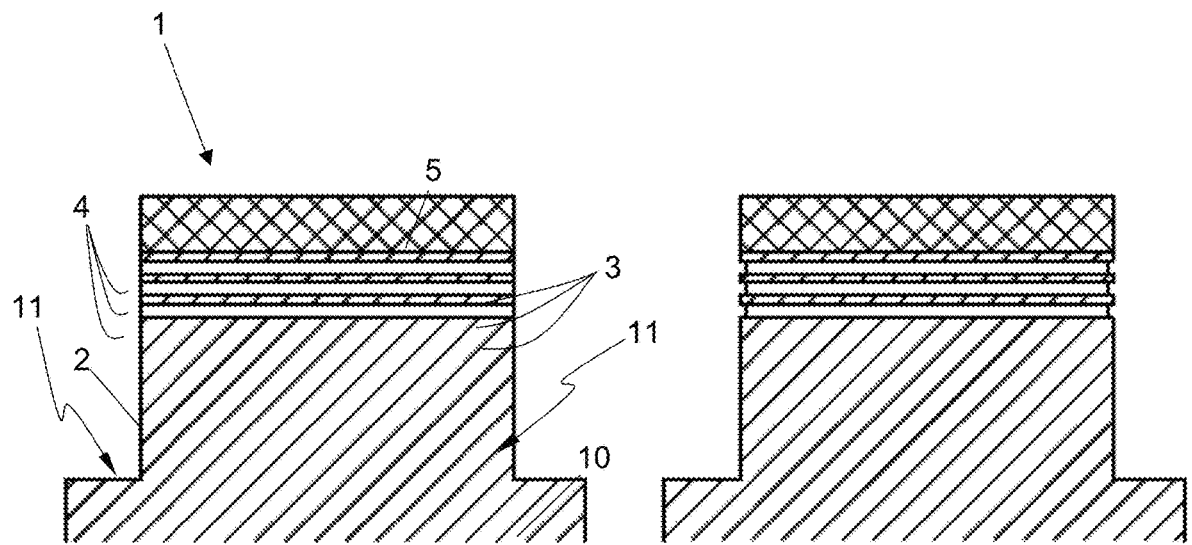
FIGS. 1a to 1d illustrate progressive stages of an etch process applied on a fin-shaped structure to which the method of the disclosure is applied.

The following experiment was conducted and serves as a proof-of-concept of the disclosure. A fin-shaped structure 1 was produced, a cross section of which is shown in FIG. 1a. The structure comprises a base portion 2 formed of silicon, that is uniform with a silicon substrate 10. The width of the structure is about 120 nm. The length of the structure measured in the direction perpendicular to the plane of the drawing, is several micrometres. The structure has two sidewalls 11 which may be perpendicular to the surface of the substrate 10, as in the drawing, but the walls may also be slightly inclined towards the vertical central plane of the fin structure 1. In general terms, the sidewalls are in an upright position relative to the substrate 10.

The structure 1 further comprises SiGe layers 3 with a thickness of about 9 nm, creating a multistack of Si nanosheets 4, the nanosheets each also having a thickness of about 9 nm. A silicon nitride portion 5 on top of the structure represents the lithographic mask used for producing the fin-shaped structure 1. The structure 1 was produced by depositing consecutive thin layers of SiGe 3 and Si 4 on the Si substrate 10, followed by the formation of the lithographic mask 5 and etching away the materials on either side of the mask down to a depth of about 105 nm measured from the upper surface of the Si substrate 10. The stack of Si and SiGe layers finds an application in the fabrication of superlattice structures in finFET transistors.

Figures 1C, 1D:
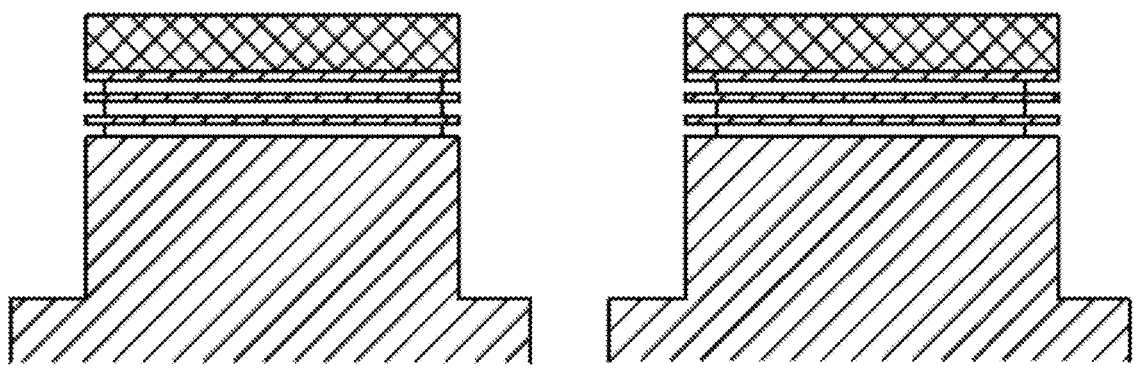

The SiGe layers 3 were then etched away by a selective etch process, which may be any process known in the art for this purpose wherein the SiGe is etched progressively inwards from the sidewalls 11 of the fin-shaped structure 1, relative to the base portion 2, the mask portion 5, and the silicon nanosheets 4. FIGS. 1b, 1c and 1d respectively show the structure at etch times of 10s, 20s and 30s. The lateral etch depth was respectively about 4 nm, 10 nm and 19 nm at these points in time. At each of these etch depths, a Raman spectroscopy measurement was done, using a laser beam oriented perpendicularly with respect to the substrate 10 onto which the fin-shaped structure 1 is positioned. The laser light had a wavelength of 532 nm and was polarized in the direction of the length of the fin structure 1. The laser was focused on a spot having a diameter of about one micrometre (i.e. the laser beam diameter itself was about 1 micrometre), that overlapped the full width of the fin structure 1. The measurement time at each depth was 100s. Generally when applying the Raman-spectroscopy based embodiment of the disclosure, the measurement time may range from short (for example between 5 and 10s) up to several minutes, depending on the laser power or other parameters.

Figure 2:
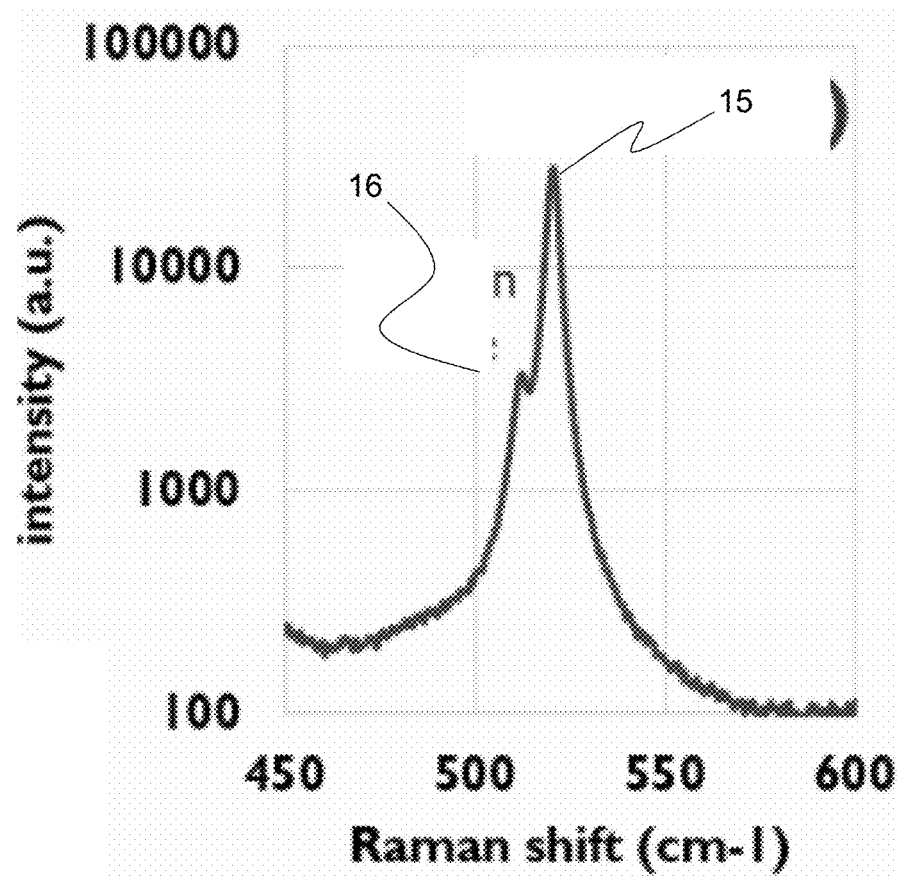
FIG. 2 shows a typical Raman spectrum obtained by the method of the disclosure from the structure shown in FIGS. 1a to 1d.
Figure 3:
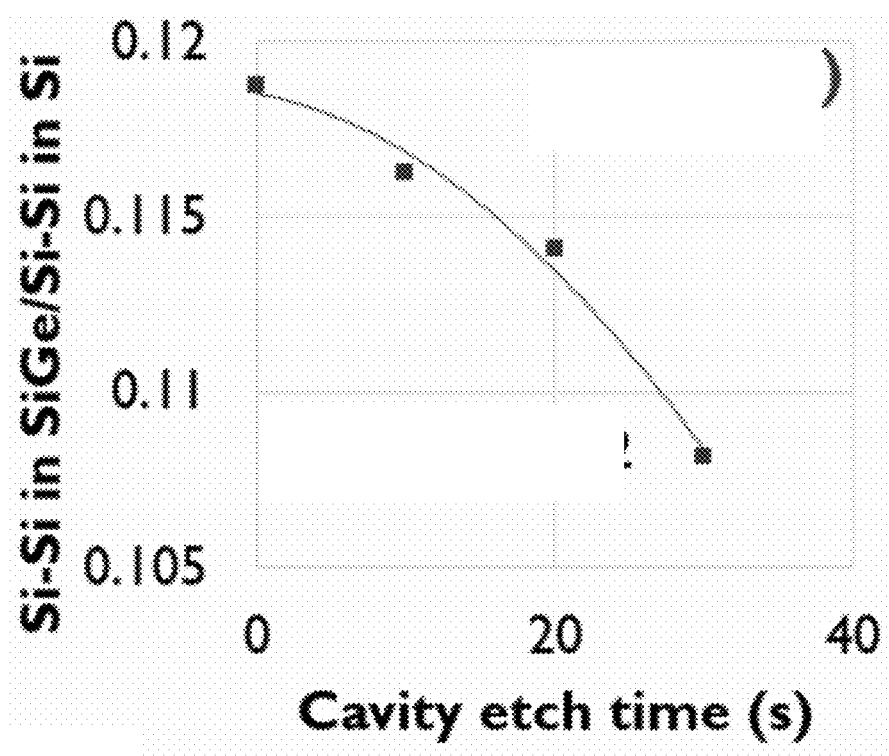
FIG. 3 shows the relation between the ratio of the intensity of two characteristic peaks from the spectrum, and the etch time.
Figure 4:
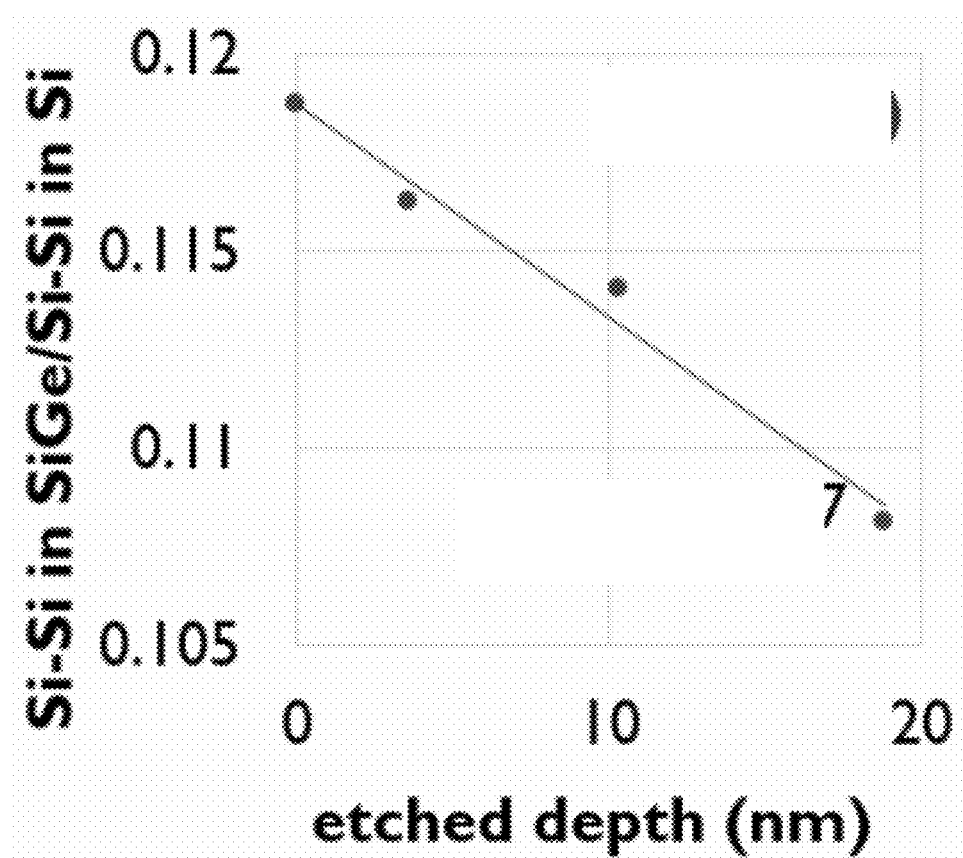
FIG. 4 shows the relation between the same ratio that is represented in FIG. 3, but now as a function of the etch depth.

FIG. 2 shows the Raman response at the start of the etch process, i.e. corresponding to the structure shown in FIG. 1a. The strong peak 15 at 521 cm$^{-1}$ is coming from Si—Si vibrations in the substrate 10, the base portion 2 and/or the Si nanosheets 4, but at the same time a distinct satellite peak 16 appears at slightly lower frequency than the main 521 cm$^{-1}$ peak. This feature originates from Si—Si vibrations in the SiGe material. The intensity of this second peak is a function of the remaining volume of SiGe material, and therefore directly related to the etch depth. FIG. 3 shows the Si—Si satellite peak intensity normalized to the Si—Si main peak intensity, i.e. the ratio between the satellite peak 16 and the main peak 15, as a function of the etch time. A non-linear decrease of the intensity ratio with longer etch time is demonstrated. However when using the total etched depth as the abscissa parameter, as shown in FIG. 4, the relationship becomes linear. This linear relation represents a one-on-one relation between the ratio and the etch depth, i.e. a relation that enables to determine the etch depth when the ratio is known. The relation thus allows to determine the etch depth by measuring the Raman spectrum and deriving from said spectrum the value of the ratio of the satellite peak intensity to the main peak intensity. The method thereby allows monitoring of the etch depth by performing regular Raman measurements during the etch process.

The use of the SiGe/Si ratio as the depth-related parameter is itself related to the use of Raman spectroscopy, because it was found that both the SiGe-related peak 16 and the Si-related peak 15 increase with increasing etch depth, which was unexpected and which may be attributed to the combined effect of a reduction in both the reflectivity and the absorptivity of the sample. The Si-peak however rises faster than the SiGe-related peak, so that the ratio exhibits a reduction as a function of the etch depth.

A similar relation between the Raman peak ratio and the recess depth has been verified on nano-sheet structures of similar dimensions than the ones shown in FIGS. 1a to 1d, but comprising a stack of SiO$_2$ sheets interspaced with polysilicon sheets having various degrees of recess depths relative to the SiO$_2$ sheets.

Nevertheless, the recess-related parameter may be other than said ratio, which is the case when other spectroscopy techniques are used (see further). In many cases, the recess-related parameter may simply be the intensity of one particular peak in the spectrum, or the integrated area under said peak, the peak being directly representative of the amount of a particular material in the irradiated structure. This parameter then decreases as a function of increasing recess depths. The peak or the integrated peak area is usually based on a spectrum expressed in arbitrary units (a.u.) as shown in FIG. 2, said units being independent of the specific measurement conditions applied during the measurement.

The method of the disclosure is thus not limited to the set of conditions defining the above-described experiment. The method is not applicable only to a fin-shaped structure 1 wherein the etched layer extends between the two sidewalls 11 of the structure, but generally to any structure having at least one sidewall that is upright with respect to the substrate onto which the structure is formed, with at least one lateral recess extending along the sidewall. The method is applicable to an array of parallel fins, each being recessed from the side in the manner described above. In the latter case, the width of the beam may irradiate several fins of the array. For example, an array of the above-described fin-shaped structures may have a pitch of about 400 nm, so that a laser beam having a diameter of 1 micrometre irradiates two adjacent fins of the array. When the recess-related parameter is the ratio of two peaks as described above, the number of irradiated fins is factored out in the ratio value. However, when the peak value itself, or the integrated area under the peak is used as the depth-related parameter, the number of irradiated fins may need to be taken into account when calculating the recess depth in each of the fins.

The fins may be more narrow than the structure used in the experiment, for example having a width in the order of 20 nm. As stated above, the parameter chosen in the experiment is the ratio between the intensity of the satellite peak relative to the intensity of the main peak. This is true for the particular case of the SiGe layers etched relative to Si. For other geometries and materials, other parameters may be applicable. The method is for example applicable also to similar superlattice structures as in FIGS. 1a to 1d but with SiO$_2$ and amorphous Si replacing respectively Si and SiGe. The one-on-one relation is generally linear, which allows the relation to be derived in a wide range of lateral depths, based on only a few calibration measurements. However, also when the relation is not linear, it may be determined across a wide range of depths by a more thorough calibration. The method is therefore not limited to linear relations between the parameter and the lateral depth.

The disclosure was verified on the basis of an etch process, but generally the disclosure is related to measuring a lateral recess depth, regardless of the process by which this depth has been produced. The method may for example also be used to measure progressively the decreasing depth of a lateral recess as the recess is being filled with a filling material. For example, when the structure of FIGS. 1a to 1d is used as a superlattice, the recesses may be filled with a different material, for example TiN to create spacers in between adjacent Si layers. The method of the disclosure can be used to measure the decreasing depth, based on a spectroscopic response that is sensitive to the progressively increasing volume of said different material in the recesses. In the specific case of spacers filled with TiN, the decreasing depth can for example be detected by the method of the disclosure, not using Raman spectroscopy which is not suitable for TiN, but using for example EDS (see further).

The disclosure is not limited to the use of an incident laser beam and analysis via Raman spectroscopy. When this combination is used, the wavelength of the incident light is such that it probes the entire region of interest. It is also important that the laser light is polarized in the length direction of the sidewall or sidewalls of the structure, into which sidewall(s) a lateral recess is formed.

A number of alternative energy beams and spectroscopic measurement techniques applicable in the disclosure are summarized hereafter. Using EDS, the energy beam directed at the structure is an electron beam, and the response can be measured by detecting X-rays generated by electrons from the beam which excite inner shell electrons in the structure, which then relax and emit X-rays at an energy level that is characteristic for the excited material. The spectroscopic response can be therefore a spectrum of X-ray intensity as a function of X-ray energy. For the structure of FIGS. 1a to 1d, the Ge-related peak in the spectrum can be sensitive to the etch depth, with the peak itself or the integrated area under the peak decreasing for increasing recess depths. The landing energy of the e-beam can be typically higher than about 4 keV. Successful experiments were done on the structure of FIGS. 1a to 1 d using an e-beam with landing energy of 5.7 keV and a measurement time of 60s.

Using XPS, the energy beam directed at the structure is an X-ray beam. The material is ionized through the ejection of inner shell electrons which are detected and whose energy characterizes the material. The spectroscopic response is now a spectrum of emitted electron intensity (electron count) as a function of the binding energy of the inner shell electrons in the various materials, taking into account that the kinetic energy of the emitted electrons is equal to the X-ray energy (known) minus the binding energy. Successful experiments were done on the structure of FIGS. 1a to 1d, using an aluminium-based X-ray source producing X-rays with energy of 1.48 keV, which showed that the 3d Ge-related peak in the spectrum, at a binding energy of about 30 eV, is sensitive to the etch depth, with the peak itself or the integrated area under the peak decreasing for increasing recess depths. The measurement time in this case was 2 hours. The use of XPS however does require the removal of the hardmask 5.

Another alternative is the use of Secondary ion mass spectrometry (SIMS), wherein the incident energy beam is an ion beam, which sputters material from the structure in the form of emitted ions, released layer by layer from the structure. The emitted ions are detected and analysed in terms of their mass. The mass is determined e.g. by measuring the time of flight of the ionized species. The spectroscopic response is thus a spectrum of ion counts as a function of the time of flight or the mass of the various materials in the structure. This technique is however invasive as the top layers are sputtered before the signal related to the material at the location of the recess is detected. In relation to this, the measurement time is also longer than the formerly cited techniques. Nevertheless, successful experiments were done on the structure of FIGS. 1a to 1d, which showed that the Ge-related peaks (Ge$^-$, SiGe$^-$, Ge$^-_2$) in the SIMS spectrum were sensitive to the recess depth, with each of the peaks or the integrated areas under the peaks decreasing for increasing recess depths. The measurement time may be one hour or more, during which time the material is progressively sputtered away from the top of the structures. While sputtering away the SiGe layers 3 during consecutive phases of the total sputter time, the recorded spectra enable to determine the etch depth of the different SiGe layers as the intensity of the Ge-related peaks differs depending on the depth of the respective recesses (i.e. depending on which of the structures shown in FIGS. 1a to 1d is being subjected to the sputtering beam).

Other existing spectrometry techniques known in the art are usable in the method and in an apparatus of the disclosure, for example XRF (X-ray fluoresence), XRD (X-ray diffraction analysis) and RBS (Rutherford Backscattering spectrometry).

The energy beam is not necessarily oriented perpendicularly to the surface of the substrate 10. The optimal beam orientation may depend on the applied spectroscopy technique.

The disclosure is not limited to determining the depth of a recess obtainable by removing a layer of a first material, for example the SiGe layers 3 in FIG. 1, that is sandwiched between two layers of a second material different from the first, such as the Si base portion 2 and the Si-layers 4 in FIGS. 1a to 1d. The recess could be formed in a structure formed of a single material, provided that the spectroscopy technique that is applied is sensitive to the change in volume of this material as a function of the recess depth.

The method of the disclosure can be applied in-line, for example integrated in a semiconductor manufacturing process that includes a lateral etch process as described above. In this way, the method enables a fast and (in most cases) non-invasive measurement of the etch depth at various times of the etch process, allowing an in-line verification of the etch process.

The method may be performed using known spectroscopy tools which include an energy beam source, such as a laser or e-beam source, a detector and a processing unit for numerically processing the obtained spectra. The disclosure is however related also to a specific apparatus for performing the method of the disclosure, which comprises the same basic components, and wherein the processing unit has access to the previously established relation between the parameter, for example the ratio between the satellite peak intensity and the main peak intensity in the case of the Si/SiGe layer stack, and the recess depth, when the combination laser+Raman spectroscopy is applied. Said relation may be stored in a memory incorporated in or accessible to the processing unit. The processing unit is furthermore configured to perform the following steps:

obtain the spectroscopic response from the detector,
determine on the basis of the spectroscopic response obtained from the detector, the value of the parameter,
derive from the obtained parameter value and from the previously established one-on-one relation, the recess depth.

Generally the processing unit is a computer programmed to perform the above steps. The disclosure is related also to such a computer program as such.

Figure 5A:
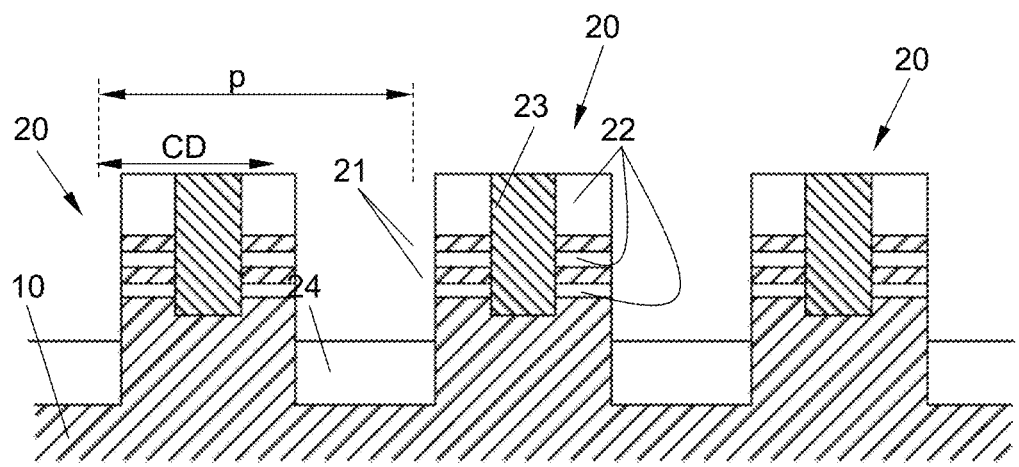
FIGS. 5a and 5b illustrate the application of the method of the disclosure to an array of forksheet-type fin structures.
Figure 5B:
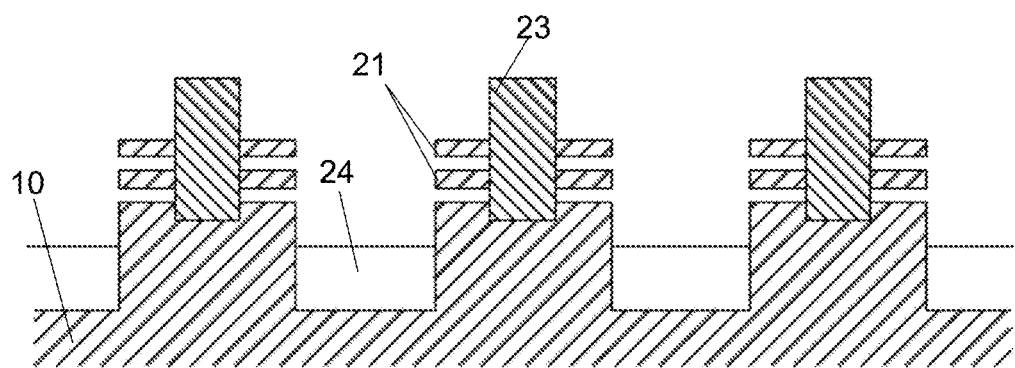

The method of the disclosure was applied also to so-called forksheet structures, as illustrated in FIGS. 5a and 5b. An array of these forksheet structures was provided, having a critical dimension CD of about 50 nm and a pitch p of about 90 nm. As known in the art, forksheet structures are fin-shaped structures comprising nano-sheets, as in the structure of FIGS. 1a to 1d, but with a vertical wall separating the nano-sheets on either side of the fin's central vertical plane. Forksheet fins 20 as shown in FIG. 5a were processed on a Si substrate 10. Each fin comprises alternating Si nanosheets 21 and SiGe nanosheets 22. The top SiGe nanosheet has a higher thickness than the lower SiGe nanosheets. The vertical wall 23 comprises SiN, and possibly additional layers not shown in the drawing, but well-known in the art. A layer of STI (Shallow Trench Isolation) oxide 24 separates the structures. The SiGe was etched relative to the Si, resulting in the laterally etched structures shown in FIG. 5b. Both the non-etched and the etched structures, at various stages of the etch process corresponding to various etch depths, were subjected to the method of the disclosure, using a variety of different spectroscopy techniques.

Figure 6:
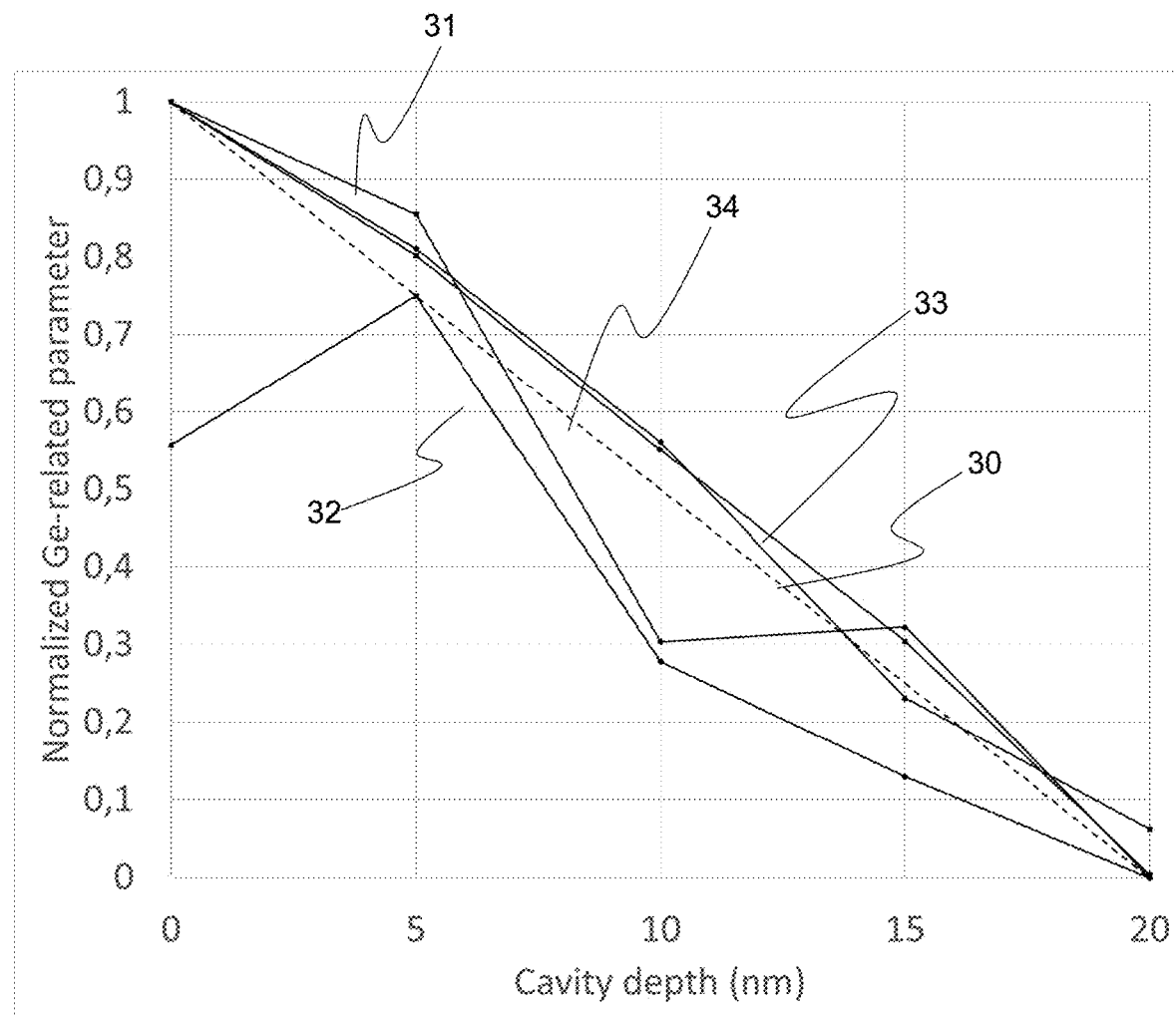
FIG. 6 shows the relation between various parameters derived from the method using different spectroscopy techniques, and the etch depth, for the forksheet structures shown in FIGS. 5a and 5b.

FIG. 6 shows the normalized characteristic parameter values as a function of the etch depth, for four spectroscopy techniques: Raman (curve 30) EDS (curve 31), XPS (curve 32) and SIMS (curve 33), as well as the ratio of the SiGe volume at each depth relative to the SiGe volume at the start of the etch process (curve 34). The parameters used are different depending on the spectroscopy technique. For instance, for the Raman curve 30, the ratio was used of the SiGe-related peak in the spectrum, relative to the Si-related peak, as explained above with reference to FIG. 2. For EDS and XPS, the parameter is the integrated intensity of the typical Ge-related peak (i.e. the area under the peak) in the spectrum that is representative of the SiGe volume. For SIMS, three different Ge-related peaks turned out to be representative of the SiGe volume. The SIMS-related parameter used in FIG. 6 is based on the integrated intensity of one of these three peaks, measured during a sputter time of about 1 hour.

It is seen that the XPS curve 32 has one outlier value for the zero-depth measurement point. This is believed to be due to the influence of a thin SiO2 layer that covers the structures. Apart from this one data point however, it is clear that all these techniques yield a suitable one on one relation between the parameter and the etch depth, that enables to determine the etch depth by measuring the parameter in question.

While the disclosure has been illustrated and described in detail in the drawings and foregoing description, such illustration and description are to be considered illustrative or exemplary and not restrictive. Other variations to the disclosed embodiments can be understood and effected by those skilled in the art in practicing the claimed disclosure, from a study of the drawings, the disclosure and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

The invention claimed is:

1. A method for measuring a lateral recess depth in a microstructure positioned on a substrate, the method comprising the steps of:
    directing an energy beam at the microstructure, the microstructure comprising:
        an elongate sidewall in an upright position relative to the substrate and at least one lateral recess formed from the sidewall inwards and extending essentially parallel to a surface of the substrate, the at least one lateral recess having the lateral recess depth, and
        at least one first layer oriented essentially parallel to the surface of the substrate, the at least one first layer being sandwiched between two adjacent layers oriented essentially parallel to the surface of the substrate, wherein the at least one first layer and the two adjacent layers extend from the elongate sidewall, wherein the at least one first layer is recessed relative to the adjacent layers, and wherein the at least one lateral recess is formed in the at least one first layer;
    measuring a spectroscopic response generated by an interaction between an incident beam and the microstructure;
    detecting one or more peaks in the response and deriving from said one or more peaks a parameter value that is representative of the lateral recess depth, said parameter value having a previously established one-on-one relation to the lateral recess depth; and
    deriving the recess depth from the parameter value, using the previously established relation.

2. The method according to claim 1, wherein the lateral recess depth is an etch depth, formed in an etching process wherein the first layer is etched progressively with respect to the adjacent layers, the etching process progressing from the sidewall inwards.

3. The method according to claim 1, wherein the first layer is formed of a first material and the adjacent layers are formed of a second material different from the first material.

4. The method according to claim 3, wherein:
    the substrate is a silicon substrate,
    the microstructure is a fin-shaped microstructure having two elongate sidewalls, and wherein the first layer and the adjacent layers extend between said two sidewalls,
    the first material is SiGe and the second material is Si,
    the energy beam is a laser beam and the spectroscopic response is a Raman response,
    the fin-shaped microstructure comprises a silicon base portion that is uniform with the substrate, and on said base portion a stack of silicon nanosheets separated from each other and from the base portion by SiGe layers recessed relative to said Si nano-sheets,
    the parameter value is a ratio between an intensity peak in a Raman spectrum related to vibrations of silicon atoms in the SiGe layers, and an intensity peak related to vibrations of silicon atoms in the silicon substrate, the base portion and/or the Si nanosheets, and
    the previously established relation is linear.

5. The method according to claim 1, wherein the energy beam is a laser beam, the light of the laser beam being polarized in the length direction of the sidewall, and wherein the spectroscopic response is a Raman spectroscopic response.

6. The method according to claim 1, wherein the energy beam is an electron beam, and wherein the spectroscopic response is an Energy-Dispersive X-ray Spectroscopy response.

7. The method according to claim 1, wherein the energy beam is an X-ray beam, and wherein the spectroscopic response is an X-Ray photoelectron Spectroscopy response.

8. The method according to claim 1, wherein the energy beam is an ion beam, and wherein the spectroscopic response is a Secondary Ion Mass Spectrometry response.

9. The method according to claim 1, wherein the previously established one-to-one relation is a linear relation.

10. The method according to claim 1, wherein the method is performed in-line and in a semiconductor processing line.

* * * * *